(12) United States Patent
Kubo et al.

(10) Patent No.: US 11,435,415 B2
(45) Date of Patent: Sep. 6, 2022

(54) MAGNETIC SENSOR ELEMENT AND MAGNETIC SENSOR DEVICE

(71) Applicants: CITIZEN FINEDEVICE CO., LTD., Yamanashi (JP); CITIZEN WATCH CO., LTD., Tokyo (JP); SHINSHU UNIVERSITY, Nagano (JP)

(72) Inventors: Toshiya Kubo, Yamanashi (JP); Mitsunori Miyamoto, Yamanashi (JP); Toshiro Sato, Nagano (JP)

(73) Assignees: CITIZEN FINEDEVICE CO., LTD., Yamanashi (JP); CITIZEN WATCH CO., LTD., Nishitokyo (JP); SHINSHU UNIVERSITY, Nagano (JP)

( * ) Notice: Subject to any disclaimer, the term of this patent is extended or adjusted under 35 U.S.C. 154(b) by 256 days.

(21) Appl. No.: 16/651,900

(22) PCT Filed: Sep. 28, 2018

(86) PCT No.: PCT/JP2018/036519
§ 371 (c)(1),
(2) Date: Mar. 27, 2020

(87) PCT Pub. No.: WO2019/066050
PCT Pub. Date: Apr. 4, 2019

(65) Prior Publication Data
US 2020/0309869 A1    Oct. 1, 2020

(30) Foreign Application Priority Data
Sep. 29, 2017    (JP) .................. JP2017-190920

(51) Int. Cl.
*G01R 33/032*    (2006.01)
*G01R 15/24*    (2006.01)
*G02B 6/024*    (2006.01)

(52) U.S. Cl.
CPC ....... *G01R 33/0322* (2013.01); *G01R 15/246* (2013.01); *G02B 6/024* (2013.01)

(58) Field of Classification Search
CPC .... G01R 15/245; G01R 33/26; G01R 33/032; G01R 15/241; G01R 15/24; G01R 33/345;
(Continued)

(56) References Cited

U.S. PATENT DOCUMENTS 4,357,676 A * 11/1982 Brown .................... G06E 3/005
359/561
5,463,316 A * 10/1995 Shirai ................ G01R 33/0322
324/244.1
(Continued)

FOREIGN PATENT DOCUMENTS

JP    59-27266 A    2/1984
JP    6-18639 A    1/1994
(Continued)

OTHER PUBLICATIONS

International Search Report for PCT/JP2018/036519 dated Dec. 18, 2018 (PCT/ISA/210).
(Continued)

*Primary Examiner* — Vinh P Nguyen
(74) *Attorney, Agent, or Firm* — Sughrue Mion, PLLC

(57) ABSTRACT

To provide a magnetic sensor element and a magnetic sensor device that can be easily manufactured and can reduce a loss of light to the extent possible. The above-described problem is solved by a magnetic sensor element comprising a planar lightwave circuit (11) provided with a light branching part (12), an input optical fiber (19) and an output optical fiber (20) connected to the planar lightwave circuit (11), a metal magnetic body type light transmitting film (30) that is provided on one end surface of the planar lightwave circuit
(Continued)

(11) and transmits light entered from the input optical fiber (19), and a reflecting film (40) that is provided on the metal magnetic body type light transmitting film (30) and reflects the transmitted light. The output optical fiber (20) is a polarization-plane maintaining optical fiber, and the input optical fiber (19) and the output optical fiber (20) are aligned and connected to the planar lightwave circuit (11).

6 Claims, 13 Drawing Sheets

(58) Field of Classification Search
CPC ...... G01R 33/02; G01R 15/242; G01R 33/00; G01R 15/248; G01R 15/246; G01R 33/0322; G02F 1/095; G02F 1/0115; G02F 1/011; G02F 1/0036; G02F 1/365; G02F 2201/02; G02F 1/295; G02F 1/125; G02F 1/225; G02B 6/024
See application file for complete search history.

(56) References Cited

U.S. PATENT DOCUMENTS

| | | | | |
|---|---|---|---|---|
| 5,699,461 | A | 12/1997 | Minemoto et al. | |
| 6,014,235 | A * | 1/2000 | Norte | G11C 21/00 372/38.1 |
| 6,211,996 | B1 * | 4/2001 | Fuse | H03C 7/00 359/238 |
| 6,574,015 | B1 * | 6/2003 | Tselikov | G02B 6/272 |
| 7,006,736 | B2 * | 2/2006 | Lee | G02B 6/12007 385/47 |
| 9,964,609 | B2 * | 5/2018 | Ichihara | G01R 33/26 |
| 2011/0169487 | A1 | 7/2011 | Miki | |

FOREIGN PATENT DOCUMENTS

| | | | |
|---|---|---|---|
| JP | 7-020217 A | | 1/1995 |
| JP | 8-219825 A | | 8/1996 |
| JP | 9-33586 A | | 2/1997 |
| JP | 2000338154 A | * | 12/2000 |
| JP | 2001-033492 A | | 2/2001 |
| JP | 2007-106653 A | | 4/2007 |
| JP | 2011-141172 A | | 7/2011 |
| JP | 4875835 B2 | | 2/2012 |

OTHER PUBLICATIONS

Written Opinion of the International Searching Authority for PCT/JP2018/036519 dated Dec. 18, 2018 (PCT/ISA/237).

* cited by examiner

MAGNETIC SENSOR ELEMENT AND MAGNETIC SENSOR DEVICE

CROSS REFERENCE TO RELATED APPLICATIONS

This application is a National Stage of International Application No. PCT/JP2018/036519 filed Sep. 28, 2018, claiming priority based on Japanese Patent Application No. 2017-190920, filed Sep. 29, 2017.

FIELD OF THE INVENTION

The present invention relates to a magnetic sensor element and a magnetic sensor device that detect a magnetic field change by Faraday rotation. More specifically, the present invention relates to a magnetic sensor element and a magnetic sensor device in which a sensor head generates a rotation of a polarization plane or a phase difference in response to an external electromagnetic field or the like, and uses the rotation or the phase difference for sensing.

BACKGROUND ART

A polarization-plane maintaining optical fiber type magnetic field sensor has the advantages of being capable of obtaining an output corresponding to a magnetic field strength, and being capable of increasing a measurement accuracy even when a light source or a light-receiving element is disposed in a position far away from the measuring magnetic field by the polarization-plane maintaining optical fiber. However, in such a magnetic field sensor, when transmission characteristics of the optical fiber change due to output fluctuations of the light source, temperature changes, or the like, the disadvantage arises that an error occurs in the measured value. Further, because two polarization-plane maintaining optical fibers are required on both sides sandwiching the Faraday element, there is also a problem that the magnetic field sensor is difficult to handle.

In response to the above-described problems, Patent Document 1 proposes a polarization-plane maintaining optical fiber type magnetic field sensor that is stable against changes in transmission characteristics of the optical fiber caused by output fluctuations of the light source, temperature changes, and the like and, with only one polarization-plane maintaining optical fiber, is easy to handle. This magnetic field sensor is a polarization-plane maintaining optical fiber type magnetic field sensor that uses a light source, a polarization-plane maintaining optical fiber, a Faraday element, and a light-receiving element, and is provided with a polarization device for making the light from the light source enter as linearly polarized light having an angle of 45° relative to a specific polarizing axis of the polarization-plane maintaining optical fiber between the light source and the polarization-plane maintaining optical fiber, a quarter wave plate between the polarization-plane maintaining optical fiber and the Faraday element, and a reflecting plate on the other side of the Faraday element.

PATENT DOCUMENTS

Patent Document 1: Japanese Laid-Open Patent Application No. H07-20217

SUMMARY OF THE INVENTION

Problems to be Solved by the Invention

In the magnetic field sensor proposed in Patent Document 1, the light entered through the polarization-plane maintaining optical fiber needs to be reflected by the reflecting plate, and the reflected light needs to be returned to the polarization-plane maintaining optical fiber. That is, it is necessary to align an optical axis of the polarization-plane maintaining optical fiber with optical axes of a path of the ¼-λ plate, the Faraday element, and the reflecting plate. When the optical axes are not aligned, a loss of light increases and a performance of the magnetic field sensor deteriorates. In order to align the optical axes, it is necessary to increase a shape accuracy of each part or accurately assemble the parts, resulting in the problem that manufacturing is difficult.

Further, with the polarization-plane maintaining optical fiber used for the purpose of maintaining linearly polarized light, when the light is further transmitted by a polarization-plane maintaining optical fiber immediately after the rotation of the polarized-light plane by Faraday rotation, the disadvantage arises that there is a phase difference in the polarized component due to the effects of a beat length.

As a structure that does not generate a phase difference, as long as a sensor head composed of a planar lightwave circuit (PLC) with a single mode optical fiber fixed thereto and a polarization-plane maintaining optical fiber are connected, and a magnetic film that generates polarization rotation in the sensor head and λ/4 wave plate are arranged, the polarized-light plane can be precisely rotated without being affected by the outside. In this way, arranging the magnetic film and λ/4 wave plate in the PLC is easy in terms of manufacturing, but the magnetic film and λ/4 wave plate need to be accurately arranged to make it possible to suppress light loss and maintain an intensity of the light returned to a light receiver.

The present invention has been made to solve the above-described problems, and an object of the present invention is to provide a magnetic sensor element and a magnetic sensor device that can be easily manufactured and can reduce light loss to the extent possible.

Means for Solving the Problems (1) A magnetic sensor element according to the present invention is a magnetic sensor element comprising a planar lightwave circuit provided with a light branching part, an input optical fiber and an output optical fiber connected to the planar lightwave circuit, a metal magnetic body type light transmitting film that is provided on one end surface of the planar lightwave circuit and transmits light entered from the input optical fiber, and a reflecting film that is provided on the metal magnetic body type light transmitting film and reflects the transmitted light. The output optical fiber is a polarization-plane maintaining optical fiber, and the input optical fiber and the output optical fiber are aligned and connected to the planar lightwave circuit.

According to this invention, the magnetic sensor element comprises the planar lightwave circuit provided with the light branching part, and thus a polarization plane is readily maintained in the planar lightwave circuit even with disturbance caused by twisting, bending, or the like, making it possible to precisely propagate a phase modulation that occurs due to Faraday rotation. The input optical fiber is connected to the planar lightwave circuit, and thus the linearly polarized light that has entered the planar lightwave circuit from the input optical fiber can be propagated through the planar lightwave circuit as is without being branched by a conventional branching coupler. The output optical fiber is a polarization-plane maintaining optical fiber, and the input optical fiber and the output optical fiber are aligned and connected to the planar lightwave circuit, and thus there is no need to provide a wave plate in the planar lightwave circuit, making it possible to suppress the loss caused by providing a wave plate such as in the related art.

In the magnetic sensor element according to the present invention, the input optical fiber and the output optical fiber are rotationally adjusted and connected. Thus, the power of light is not evenly divided by phase modulation using a wave plate as in the related art, but rather the input optical fiber and the output optical fiber are aligned so that the power is physically halved, making it possible to evenly divide the power of the light.

In the magnetic sensor element according to the present invention, when the input optical fiber is the polarization-plane maintaining optical fiber, a polarization preserving axis of the input polarization-plane maintaining optical fiber is aligned with a polarization preserving axis of the output polarization-plane maintaining optical fiber. Thus, the linearly polarized light that has entered the planar lightwave circuit from the input optical fiber can be separated into two vectors as the power of light, and propagated uniformly to the two polarization preserving axes.

In the magnetic sensor element according to the present invention, the polarization preserving axis of the input polarization-plane maintaining optical fiber and the polarization preserving axis of the output polarization-plane maintaining optical fiber are aligned at a relative angle of 45°. Thus, it is possible to be aligned with a position exactly halfway between a slow axis and a fast axis and obtain uniform light intensities.

In the magnetic sensor element according to the present invention, the planar lightwave circuit may be an optical waveguide formed by patterning, or an optical waveguide obtained by melting two optical fibers and fixing the fibers onto a substrate.

(2) A magnetic sensor device according to the present invention comprises the magnetic sensor element according to the above-described present invention, a light-emitting device that introduces linearly polarized light into an input optical fiber of the magnetic sensor element, and a light-receiving device that receives return light derived from an output optical fiber of the magnetic sensor element.

In the magnetic sensor device according to the present invention, the light-receiving device can be configured to include a polarization separating element that separates the return light into an S-polarized component and a P-polarized component, a light-receiving element that receives and converts the S-polarized component and the P-polarized component into electrical signals, and a signal processing part that processes the electrical signals.

In the magnetic sensor device according to the present invention, the light-emitting device can be configured to include a light-emitting element and a polarizer that converts light emitted from the light-emitting element into linearly polarized light.

Effect of the Invention

According to the present invention, it is possible to provide a magnetic sensor element and a magnetic sensor device that can be easily manufactured and can reduce a loss of light to the extent possible.

BRIEF DESCRIPTION OF THE DRAWINGS

FIG. 3 is explanatory views of an alignment of a polarization-plane maintaining optical fiber.

FIG. 8 is explanatory views of means for inclining and maintaining a polarization preserving axis of the polarization-plane maintaining optical fiber.

FIG. 10 is explanatory views illustrating a connection form between the planar lightwave circuit and a connecting structure part.

EMBODIMENTS OF THE INVENTION

The following describes a magnetic sensor element and a magnetic sensor device according to the present invention with reference to the drawings. The present invention is within a scope of a gist thereof and is not limited to the following descriptions and drawings.

[Magnetic Sensor Element]

Figure 1:
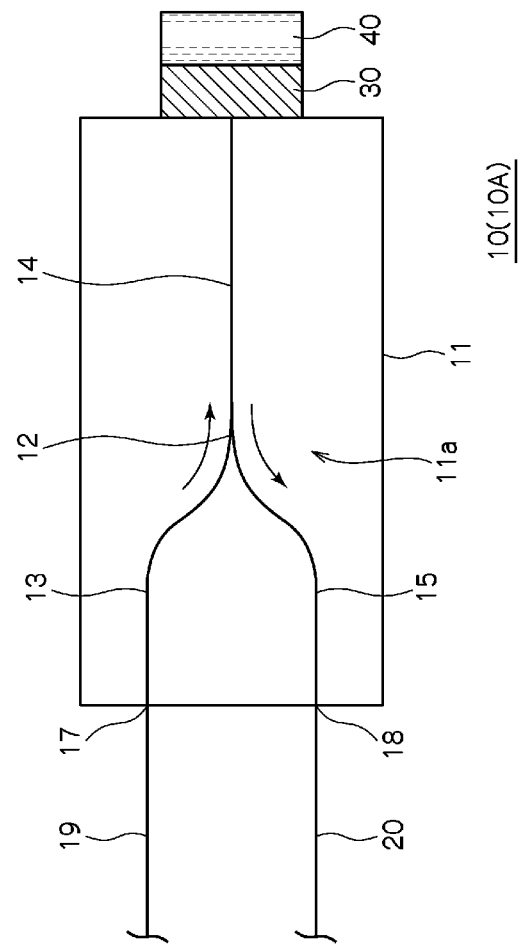
FIG. 1 is a schematic planar configuration view illustrating an example of a magnetic sensor element according to the present invention.
Figure 2:
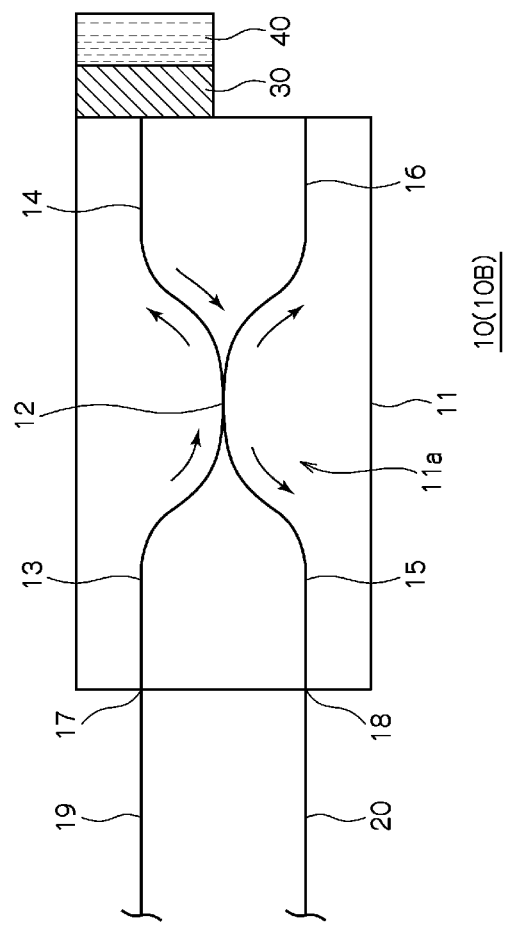
FIG. 2 is a schematic planar configuration view illustrating another example of the magnetic sensor element according to the present invention.
Figure 3A:
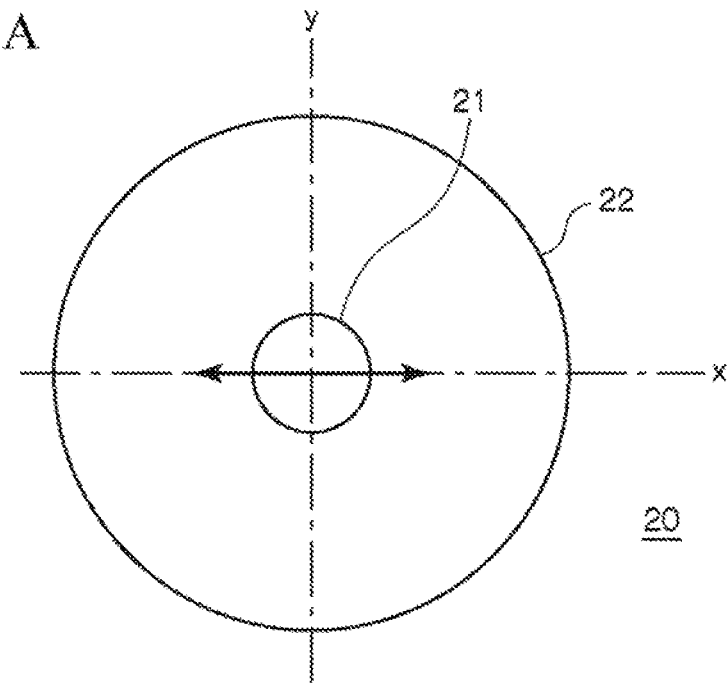
FIG. 3A illustrates a state inside a planar lightwave circuit.

As illustrated in FIG. 1 to FIG. 3, a magnetic sensor element 10 according to the present invention is a magnetic sensor element including a planar lightwave circuit 11 provided with a light branching part 12, an input optical fiber 19 and an output optical fiber 20 connected to the planar lightwave circuit 11, a metal magnetic body type light transmitting film 30 that is provided on one end surface of the planar lightwave circuit 11 and transmits light entered from the input optical fiber 19, and a reflecting film 40 that is provided on the metal magnetic body type light transmitting film 30 and reflects the transmitted light. The output optical fiber 20 is a polarization-plane maintaining optical fiber, and the input optical fiber 19 and the output optical fiber 20 are aligned and connected to the planar lightwave circuit 11.

This magnetic sensor element 10 includes the planar lightwave circuit 11 provided with the light branching part 12, and thus a polarization plane is readily maintained in the planar lightwave circuit even with disturbance caused by twisting, bending, or the like, making it possible to precisely propagate a phase modulation that occurs due to Faraday rotation. Furthermore, the input optical fiber 19 is connected to the planar lightwave circuit 11, and thus the linearly polarized light that has entered the planar lightwave circuit 11 from the input optical fiber 19 can be propagated through the planar lightwave circuit 11 as is without being branched by a conventional branching coupler. Furthermore, the output optical fiber 20 is a polarization-plane maintaining optical fiber, and the input optical fiber 19 and the output optical fiber 20 are aligned and connected to the planar lightwave circuit 11, and thus there is no need to provide a wave plate in the planar lightwave circuit, and a light intensity obtained by suppressing a loss caused by providing a wave plate can be detected. Furthermore, because the wave plate is unnecessary, the light intensity can be detected directly.

Figure 3B:
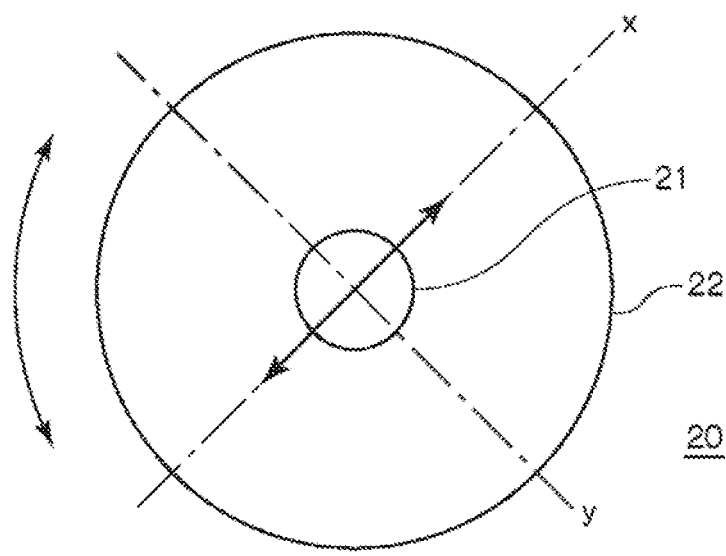
FIG. 3B is a sectional view illustrating an aligned polarization-plane maintaining optical fiber.

It should be noted that, in research conducted to date by the present inventors, a technique for branching linearly polarized light using a branching coupler to guide the linearly polarized light to a sensor head, and rotating the linearly polarized light by 45° using a quarter wave plate with an optical axis inclined by 22.5° in the sensor head was developed. This makes it possible to forcibly rotate the polarized-light plane by 45° when the entered linearly polarized light is reciprocated by the reflecting film. As a result, even if all polarization rotations are completed in the sensor head and a phase difference occurs in a subsequent optical transmission process, it is possible to detect a signal in which the light intensities of each of the P-polarized light and S-polarized light are maintained. In contrast, in the magnetic sensor element 10 according to the present invention, the linearly polarized light enters the planar lightwave circuit 11 from the input optical fiber 19, propagates in the planar lightwave circuit 11, and arrives at the metal magnetic body type light transmitting film 30 via the built-in light branching part 12. In a state without a magnetic field applied to the metal magnetic body type light transmitting film 30, at a connecting part 18 with the output optical fiber 20, the output optical fiber 20 is rotated relatively in an axial direction with respect to a polarization plane of the light branching part 12, adjusted and aligned so that the light intensities of light-receiving elements 66P, 66S are uniform, and connected as illustrated in FIG. 3B. Here, "relatively" means that the rotation in the axial direction may be performed using the input optical fiber 19 or the output optical fiber 20. In particular, when the output optical fiber 20 is a polarization-plane maintaining optical fiber, it is possible to obtain uniform light intensities by arranging the output optical fiber 20 in alignment with a position exactly halfway between a slow axis and a fast axis with respect to the linearly polarized light that has entered the planar lightwave circuit 11 from the input optical fiber 19. Accordingly, it is no longer necessary to provide a wave plate used to obtain a similar effect to date in the planar lightwave circuit, and a loss that occurs due to the provision of a wave plate can be suppressed.

Figure 5:
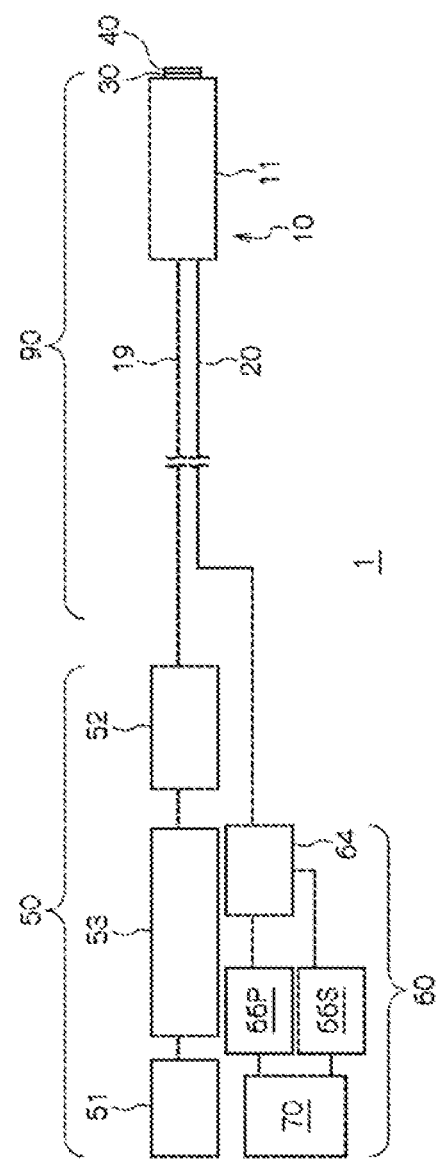
FIG. 5 is a configuration view illustrating an example of a magnetic sensor device according to the present invention.

As illustrated in FIG. 5, a magnetic sensor device 1 according to the present invention includes the magnetic sensor element 10 described above, a light-emitting device 50 that introduces linearly polarized light into the input optical fiber 19 of the magnetic sensor element 10, and a light-receiving device 60 that receives return light derived from the output optical fiber 20 of the magnetic sensor element 10.

The following describes each component of the magnetic sensor element and the magnetic sensor device in detail.

<Magnetic Sensor Element>

As illustrated in FIG. 1 and FIG. 2, the magnetic sensor element 10 includes the planar lightwave circuit 11, the input optical fiber 19 and the output optical fiber 20 connected to the planar lightwave circuit 11, the metal magnetic body type light transmitting film 30 that is provided on one end surface of the planar lightwave circuit 11 and transmits the light entered from the input optical fiber 19, and the reflecting film 40 that is provided on the metal magnetic body type light transmitting film 30 and reflects the transmitted light. The planar lightwave circuit is called a PLC.

(Planar Lightwave Circuit)

The planar lightwave circuit 11 constituting the present invention is a circuit that connects optical fibers (the input optical fiber 19 and the output optical fiber 20) to an end surface of a head part including an optical waveguide 11a. As illustrated in FIG. 1 and FIG. 2, the planar lightwave circuit 11 includes optical paths 13, 14, 15 and the light branching part 12, and is provided with the metal magnetic body type light transmitting film 30 and the reflecting film 40 on the other end surface. The input optical fiber 19 and the output optical fiber 20 are connected to this planar lightwave circuit 11 by connecting parts 17, 18, respectively. The light that has entered the optical path 13 from the connecting part 17 to which the input optical fiber 19 is connected travels as indicated by the arrows in FIG. 1 and FIG. 2, passes through the light branching part 12, and travels through the optical path 14 to the metal magnetic body type light transmitting film 30. The light transmitted through the metal magnetic body type light transmitting film 30 is reflected by the reflecting film 40, is transmitted through the metal magnetic body type light transmitting film 30 again, is subsequently returned through the optical path 14, arrives at the light branching part 12, travels through the optical path 15 as indicated by the arrow, and then enters the output optical fiber 20 connected by the connecting part 18. It should be noted that, in the example of FIG. 2, the light that has been branched by the light branching part 12 and traveled through an optical path 16 is terminated.

The connecting parts 17, 18, and the metal magnetic body type light transmitting film 30 as well as the reflecting film 40 are in a positional relationship such as illustrated in FIG. 1 and FIG. 2, and typically are provided on end surfaces of the planar lightwave circuit 11, having a quadrilateral shape, that face each other. However, the positional relationship is not limited to such a form, and these may be provided on end surfaces adjacent to each other.

The planar lightwave circuit 11 can be manufactured by various methods. For example, the planar lightwave circuit 11 may be the optical waveguide 11a (refer to FIGS. 6A to 6C) fabricated by a photolithographic technique, or the optical waveguide 11a (refer to FIGS. 7A to 7C) fabricated by melting two optical fibers and fixing the fibers onto a substrate.

Figure 6A:
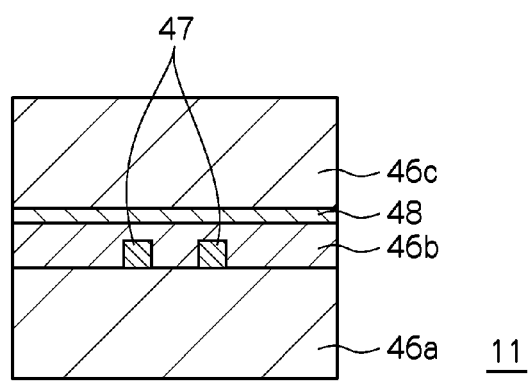
FIGS. 6A to 6C are explanatory views illustrating an example in which the planar lightwave circuit is fabricated by photolithographic technology.
Figure 6B:
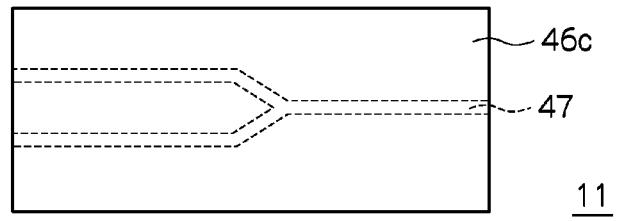
Figure 6C:
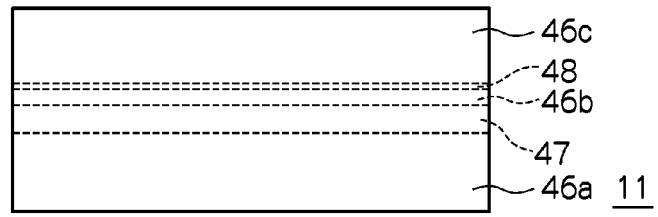

When fabricated by a photolithographic technique, the optical waveguide 11a can be fabricated by a technique similar to a large scale integration (LSI) manufacturing technique. This optical waveguide 11a, as illustrated in FIGS. 6A to 6C, for example, can be fabricated by forming a core 47, which is patterned, on a lower clad layer 46a, forming a first upper clad layer 46b that covers the core 47, and further providing a second upper clad layer 46c via an adhesive 48. It should be noted that FIG. 6A is a sectional view. FIG. 6B is a plan view. FIG. 6C is a side view.

The constituent material of this optical waveguide 11a is not particularly limited, but as the lower clad layer 46a, for example, a substrate made of quartz or Tempax (registered trademark) can be preferably used. As the core 47, a core obtained by forming a core layer composed of, for example, silicon dioxide and germanium dioxide, on the lower clad layer 46a by a method such as a flame hydrolysis deposition method (FHD method) or a chemical vapor deposition method (CVD method), and patterning the core layer by a photolithographic technique can be preferably adopted. As the first upper clad layer 46b, a layer obtained by overcoating a silicon dioxide layer by a method such as an FHD method or a CVD method so as to cover the patterned core 47 can be preferably used. Furthermore, in order to prevent light from leaking from an upper portion of the optical waveguide 11a, the second upper clad layer 46c composed of silicon dioxide or the like is preferably provided on the first upper clad layer 46b via an adhesive layer (epoxy resin or the like, for example). Once the second upper clad layer 46c is provided, the optical waveguide 11a is chipped in a dicing step or the like, and optical waveguide end surfaces are polished to form a mirror surface. The input optical fiber 19 and the output optical fiber 20 are connected to one of the mirror-finished optical waveguide end surfaces, and the metal magnetic body type light transmitting film 30 and the reflecting film 40 are sequentially provided on the other end surface.

Figure 7A:
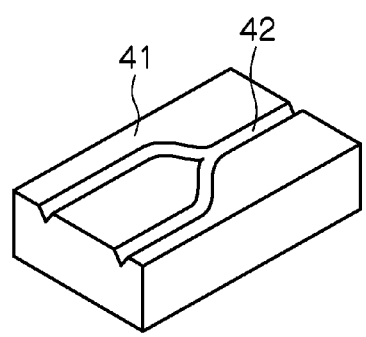
FIGS. 7A to 7C are explanatory views illustrating an example in which the planar lightwave circuit is fabricated by an optical fiber embedding method.
Figure 7B:
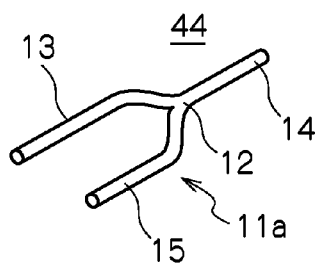
Figure 7C:
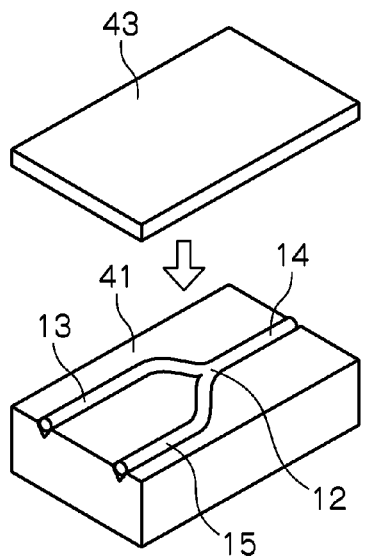
Figure 7C:
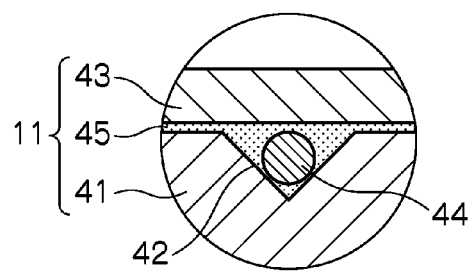

When fabricated by melting two optical fibers and fixing the fibers onto a substrate, the optical waveguide 11a may, as illustrated in FIGS. 7A to 7C, be fabricated by a method for embedding melted and connected optical fibers in a groove 42 provided in a substrate 41. In the fabrication of this optical waveguide 11a, the substrate 41 with the groove 42 formed therein is prepared as illustrated in FIG. 7A, and an embedding optical fiber 44 configured to include the optical paths 13, 14, 15 by melting and connecting the optical fibers is prepared as illustrated in FIG. 7B. Subsequently, as illustrated in FIG. 7C, the optical waveguide 11a can be fabricated by pouring the embedding optical fiber 44 into the groove 42 of the substrate 41, covering the substrate 41 with a lid base material 43 from above, and bonding these by an adhesive 45.

The constituent material of this optical waveguide 11a is also not particularly limited. Examples of the material of the substrate 41 include quartz, Tempax (registered trademark), glass, ceramic, metal, synthetic resin, and the like. When an entire shape (for example, a rectangular parallelepiped shape) of the substrate 41 is formed, the groove 42 may be simultaneously formed, or may be formed by processing the substrate 41 after the entire shape of the substrate 41 is formed. The groove 42 may have a U-shaped or a V-shaped cross-section, but preferably has a V-shaped or a substantially V-shaped cross section. With the groove 42 having a substantially V-shaped cross section, the optical fiber can be easily and precisely positioned when inserted. It should be noted that a shape and a structure of the planar lightwave circuit 11 are as desired, and need only be a shape or structure in which at least the entire optical fiber is fixed to the groove 42 of the planar lightwave circuit 11. As needed, the lid base material 43 may not be used.

In the planar lightwave circuit 11 fabricated in the examples of FIGS. 6A to 6C, FIGS. 7A to 7C, and the like, the linearly polarized light propagated through the input optical fiber 19 is entered from the connecting part 17 of the planar lightwave circuit 11, passes through the optical path 13, the light branching part 12, and the optical path 14, is transmitted through the metal magnetic body type light transmitting film 30, is reflected by the reflecting film 40, is transmitted through the metal magnetic body type light transmitting film 30 again, returns to the optical path 14, passes through the light branching part 12 and the optical path 15, is emitted from the connecting part 17 of the planar lightwave circuit 11, enters the output optical fiber 20, and is propagated through the output optical fiber 20. With such a planar lightwave circuit 11 being configured by the optical waveguide 11a formed on a substrate of quartz or the like, the polarization plane is readily maintained in the planar lightwave circuit 11, even against disturbance caused by twisting or bending. As a result, phase modulation that occurs due to Faraday rotation can be precisely propagated.

(Input Optical Fiber)

Figure 4A:
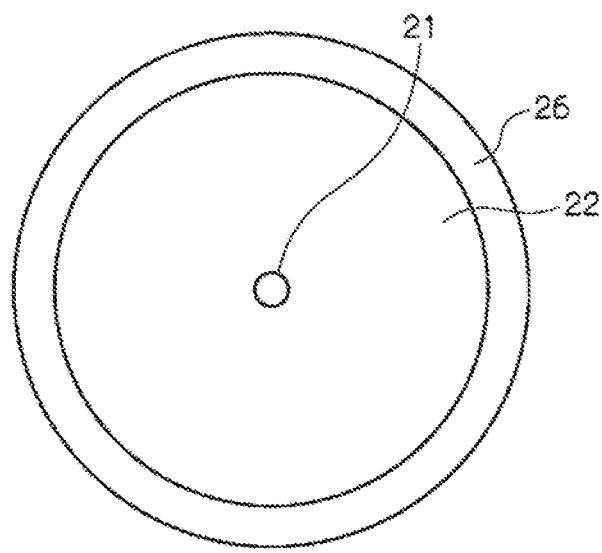
FIG. 4 is a sectional form views illustrating an example of a single mode optical fiber (A) and a polarization-plane maintaining optical fiber (B).

The input optical fiber 19 is an optical fiber that transmits linearly polarized light from the light-emitting device 50 to the planar lightwave circuit 11, and is not particularly limited as long as the fiber is an optical fiber connected to the planar lightwave circuit 11 by the connecting part 17. For example, the optical fiber may be a single mode optical fiber (may be denoted by reference numeral 19) of the form illustrated in FIG. 4A, or a polarization-plane maintaining optical fiber (may be denoted by reference numeral 19) of the form illustrated in FIG. 4B. The polarization maintaining optical fiber of the form illustrated in FIG. 4B can transmit light while maintaining the rotation and phase difference of the polarization plane of the light and, compared to the single mode optical fiber, can easily transmit the linearly polarized light from the light-emitting device 50 as is, and thus can preferably be adopted. It should be noted that, depending on the application and the fiber fixing form, the input optical fiber 19 may be a single mode optical fiber. A diameter of an optical fiber such as a polarization maintaining optical fiber or a single mode optical fiber is not particularly limited, but an optical fiber having a diameter of 125 μm is generally used. A length of the optical fiber can be selected as desired according to the form of the magnetic sensor element 10 and the form of the magnetic sensor device 1.

(Output Optical Fiber)

The output optical fiber 20 is an optical fiber that transmits the light emitted from the planar lightwave circuit 11 to the light-receiving elements 66P, 66S without disturbing the polarization state, and is connected to the planar lightwave circuit 11 by the connecting part 18. This output optical fiber 20 is preferably a polarization-plane maintaining optical fiber (may be denoted by reference numeral 20) of the form illustrated in FIG. 4B.

Figure 4B:
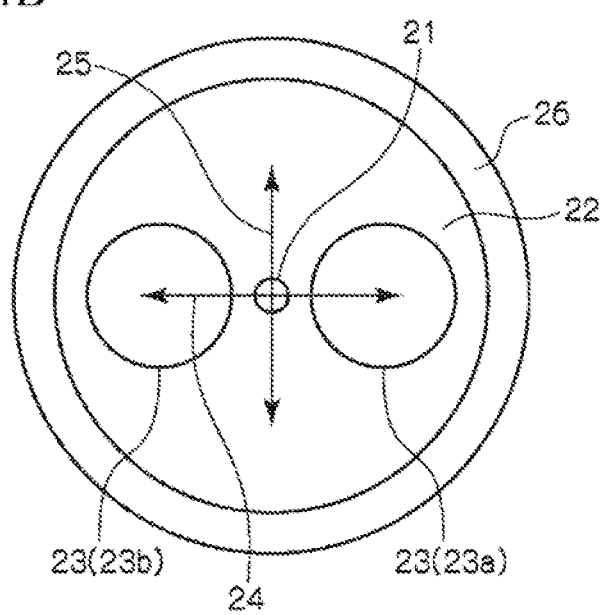

First, the polarization maintaining optical fiber will be described. Examples of the polarization-plane maintaining optical fiber include an optical fiber that can transmit light while maintaining the rotation and phase difference of the polarization plane of the light, and include a pair of stress applying parts 23 (23a, 23b) such as illustrated in FIG. 4B. The stress applying parts 23 need not necessarily be a pair, and need only be a polarization-plane maintaining optical fiber. The polarization maintaining optical fiber is an optical fiber that has a mode with two polarization planes orthogonal to each other, and examples of the polarization maintaining optical fiber include one that includes the pair of stress applying parts 23a, 23b that apply non-axisymmetric stress to a core 21, generates a propagation constant difference between two polarization modes, and suppresses coupling from each polarization mode to the other polarization mode, improving polarization maintainability. Specifically, as illustrated in FIG. 4B, the polarization maintaining fiber is configured by the core 21 at the center, a clad 22, the pair of stress applying parts 23, and a coating material 26.

The polarization maintaining optical fiber is a polarization-maintaining and absorption-reducing (PANDA) type in which each of the pair of stress applying parts 23a, 23b has a circular cross section, and can suppress fluctuations in light intensity, allowing stable measurement. The cross-sectional form includes two orthogonal polarization preserving axes (also referred to as polarization axes), that is, a slow axis 24 and a fast axis 25. The slow axis 24 is indicated by a straight line passing through a center of each of the pair of stress applying parts 23a, 23b, and a center of the core 21. The fast axis 25 is indicated by a straight line orthogonal to the slow axis 24 and passing through a center of the core 21.

In the present invention, the polarization-plane maintaining optical fiber 20 is adopted as the output optical fiber 20, thereby making it possible to propagate the return light greatly rotated by the metal magnetic body type light transmitting film 30 at a position shifted from the linear polarized-light maintaining axis of the two orthogonal axes (slow axis and fast axis) of the polarization-plane maintaining optical fiber 20. Thus, the linearly polarized light can be destroyed and light, having light intensities at a certain ratio, can be propagated to each of the two orthogonal linear polarization maintaining axes. As a result, a P-polarized component and an S-polarized component can be easily separated by light intensities by a subsequent polarization separating element, and the magnitudes of the intensities can be easily found by the light-receiving elements 66P, 66S.

(Alignment)

The input optical fiber 19 and the output optical fiber 20 are aligned and connected to the planar lightwave circuit 11 as illustrated in FIG. 3B. With the input optical fiber 19 and the output optical fiber 20 aligned and connected to the planar lightwave circuit 11, there is no need to provide a wave plate in the planar lightwave circuit, and loss caused by providing a wave plate such as in the related art can be suppressed. This "alignment" is performed by rotating either one or both of the input optical fiber 19 and the output optical fiber 20. Thus, the power of light is not evenly divided by phase modulation using a wave plate as in the related art, rather the power of the light can be evenly divided by aligning the input optical fiber 19 and the output optical fiber 20 so that the power is physically halved.

When the input optical fiber 19 is the polarization-plane maintaining optical fiber 19, the polarization preserving axes (the slow axis and the fast axis, which are polarized-light preserving axes; hereinafter the same) of the input polarization-plane maintaining optical fiber 19 and the polarization preserving axes of the output polarization-plane maintaining optical fiber 20 are relatively aligned. The "alignment" at this time is an operation for uniformly separating light that has entered the planar lightwave circuit 11 into two vectors as light intensities (powers), and propagating the light. In the alignment in this case, the polarization preserving axes of the output polarization-plane maintaining optical fiber 20 and the polarization preserving axes of the input polarization-plane maintaining optical fiber 19 are rotated by 45° at a relative angle and aligned. The term "relative angle" means that the 45° rotation may be a rightward rotation or a leftward rotation.

In these alignments and adjustments, because the input polarization-plane maintaining optical fiber 19 and the output polarization-plane maintaining optical fiber 20 are aligned in a state in which the polarization preserving axes of the slow axis and the fast axis are relatively inclined by 45°, the linearly polarized light can be separated into two vectors as powers of light. That is, light can be uniformly propagated to the two polarization preserving axes. In this state, regardless of the rotation angle between the planar lightwave circuit 11 and the polarization-plane maintaining optical fibers 19, 20, the polarization preserving axes of the polarization maintaining optical fibers 19, 20 are relatively inclined by 45°.

Whether or not the P-polarization intensity and the S-polarization intensity are uniform intensities by the alignments and adjustments can be confirmed by active alignment. At this time, when both the input optical fiber 19 and the output optical fiber 20 are the polarization-plane maintaining optical fibers 19, 20, the polarization preserving axes of the output polarization-plane maintaining optical fiber 20 and the polarization preserving axes of the input polarization-plane maintaining optical fiber 19 are rotated by 45° at a relative angle, thereby making it possible to perform alignment and adjustment without confirmation by active alignment and make the P-polarization intensity and the S-polarization intensity uniform. Accordingly, when both the input optical fiber 19 and the output optical fiber 20 are the polarization-plane maintaining optical fibers 19, 20, the confirmation task by active alignment is no longer necessary, resulting in an advantage in manufacturing.

As confirmation by active alignment, (1) when the polarization-plane maintaining optical fiber 19 is used as the input optical fiber 19, a polarizing beam splitter (PBS) is connected to the output polarization-plane maintaining optical fiber 20 to separate the light into P-polarized light and S-polarized light and, while monitoring the intensity of each of the separated P-polarized light and S-polarized light using two power meters, the input polarization-plane maintaining optical fiber 19 is rotated to perform adjustments so that the P-polarization intensity and the S-polarization intensity are uniform. At this time, because both the input optical fiber 19 and the output optical fiber 20 are the polarization-plane maintaining optical fibers, while viewing the fiber end surfaces illustrated in FIG. 4B, it is possible to perform adjustments so that the P-polarization intensity and the S-polarization intensity are uniform without performing active alignment by rotating the input polarization-plane maintaining optical fiber 19 by 45°, and perform alignments and adjustments by an extremely easy task.

Figure 8A:
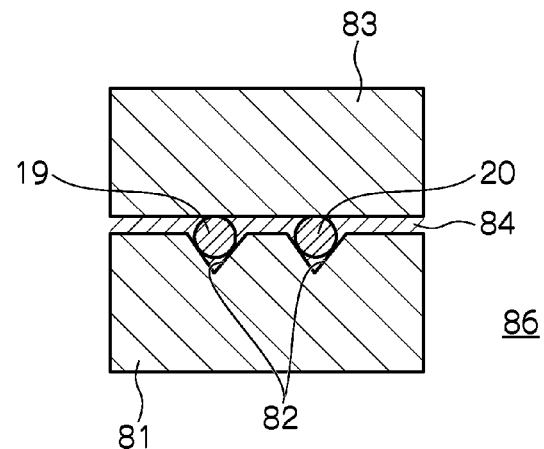
FIG. 8A is a sectional view of an optical fiber fixed by a base member and a lid member.
Figure 8B:
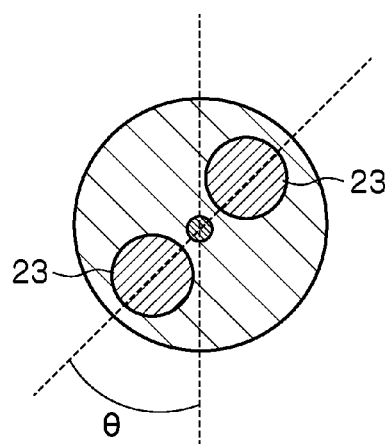
FIG. 8B and FIG. 8C are sectional views of when an input polarization-plane maintaining optical fiber and an output polarization-plane maintaining optical fiber are rotationally aligned by a relative angle of θ.
Figure 8C:
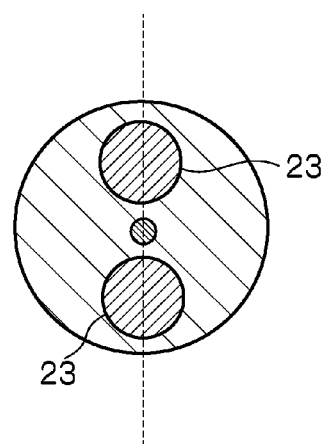

It should be noted that FIG. 8A is a sectional view of the optical fibers 19, 20 fixed by a base member 81 and a lid member 83. FIG. 8B and FIG. 8C are sectional views of when the input polarization-plane maintaining optical fiber 19 and the output polarization-plane maintaining optical fiber 20 are rotationally aligned by a relative angle of θ. This example is means for relatively inclining by 45° and maintaining the polarization preserving axes of the polarization-plane maintaining optical fibers 19, 20 without using active alignment. As illustrated in FIG. 8A, the two polarization-plane maintaining optical fibers 19, 20 are each arranged in a groove part 82 of the base member 81, end surfaces thereof are observed using a camera or the like, one polarization maintaining optical fiber is rotated in the axial direction on the basis of the stress applying part 23, and the respective polarization maintaining optical fibers 19, 20 are relatively inclined by 45° and fixed by the lid member 83 via an adhesive 84. Subsequently, the end surfaces are polished and connected to the planar lightwave circuit 11.

(2) When a single mode optical fiber is used as the input optical fiber 19 as well, similar to (1) described above, a polarizing beam splitter (PBS) is connected to the output polarization-plane maintaining optical fiber 20 to separate the light into P-polarized light and S-polarized light and, while monitoring the intensity of each of the separated P-polarized light and S-polarized light using two power meters, the input single mode optical fiber 19 is rotated to perform adjustments so that the P-polarization intensity and the S-polarization intensity are uniform. However, because the single mode optical fiber 19 is used as the input optical fiber 19 here, when this input single mode optical fiber 19 is rotated, a polarizer is or a polarizer and a half wave plate are attached in front of the single mode optical fiber 19, and the polarizer or the half wave plate is rotated to perform adjustments so that the P-polarization intensity and the S-polarization intensity are uniform.

The input optical fiber 19 and the output optical fiber 20 are connected directly to the planar lightwave circuit 11 by the respective connecting parts 17, 18. At these connecting parts 17, 18, the planar lightwave circuit 11, the input optical fiber 19, and the output optical fiber 20 can be adhered with loss suppressed to the extent possible using a refractive index-matched adhesive (preferably an ultraviolet curing type adhesive or the like). It should be noted that, if there is no vibration or the like, or if the maintaining structure is not affected by vibration or the like, the polarized light can be maintained even with a single mode optical fiber.

(Metal Magnetic Body Type Light Transmitting Film)

The metal magnetic body type light transmitting film 30 is provided on one end surface of the planar lightwave circuit 11 and acts so that light entered from the input optical fiber 19 is transmitted. This metal magnetic body type light transmitting film 30 acts to increase a rotation angle of the polarized-light plane of the linearly polarized light by the Faraday effect. The Faraday effect is an effect in which the polarized-light plane rotates when light passes through a material in a magnetic field environment. The metal magnetic body type light transmitting film 30 may be a film having a property that causes such behavior, and the type thereof is not particularly limited. Examples of the metal magnetic body type light transmitting film 30 applied, in the related art, include a magnetic garnet. Further, examples include Fe, Co, Ni, and alloys thereof. Examples of the alloys include FeNi alloy, FeCo alloy, FeNiCo alloy, and NiCo alloy. Furthermore, a granular thin film in which these ferromagnetic bodies are dispersed as fine particles in a dielectric matrix can also be used. Examples of the dielectric used as the matrix include fluorides such as $MgF_2$, and oxides such as $Al_2O_3$ and $SiO_2$.

The metal magnetic body type light transmitting film 30 is provided on one end surface of the planar lightwave circuit 11 formed from, for example, glass, crystal, a transparent synthetic resin, or the like. When a magnetic field is applied to the metal magnetic body type light transmitting film 30 and Faraday rotation occurs, an intensity change occurs in the light received by the light-receiving elements 66P, 66S as in the method in the related art, the difference in the light intensities changes substantially linearly, and measurement of the magnetic field strength becomes possible. Then, that value can also be converted to a current value. Such a "reflection type sensor head that utilizes light modulation" can maintain a low loss.

(Reflecting Film)

As illustrated in FIG. 1 and FIG. 2, the reflecting film 40 is provided on the metal magnetic body type light transmitting film 30 and reflects light transmitted through the metal magnetic body type light transmitting film 30. The reflecting film 40 is provided to reflect the light transmitted through the metal magnetic body type light transmitting film 30 and return the light to the metal magnetic body type light transmitting film 30 again. Examples of the type of reflecting film 40 include an Ag film, an Au film, an Al film, a dielectric multilayer mirror, and the like. In particular, an Ag film having a high reflectance and an Au film having a high corrosion resistance are easy to form and therefore preferable. The reflecting film 40 may be formed by a known method such as, for example, a vapor phase growth method (physical vapor deposition method, chemical vapor deposition method, vacuum vapor deposition method, or sputtering method), printing method, spin coating method, or plating method.

As described above, in the magnetic sensor element 10 according to the present invention, when (1) linearly polarized light is propagated by the input optical fiber 19 and (2) the propagated linearly polarized light enters the planar lightwave circuit 11 and then enters the metal magnetic body type light transmitting film 30, the rotation angle of the polarized-light plane increases due to the Faraday effect of the metal magnetic body of the metal magnetic body type light transmitting film 30. (3) The largely rotated light is propagated as a return light to the output optical fiber 20 and subsequently separated into a P-polarized component and an S-polarized component, and the magnitude of each intensity is found by the light-receiving element. (4) At this time, at least the output optical fiber 20 is a polarization-plane maintaining optical fiber, and the input optical fiber 19 and the output optical fiber 20 are aligned and connected to the planar lightwave circuit 11. Thus, the power of light is not evenly divided by phase modulation using a wave plate as in the related art, rather the input optical fiber 19 and the output optical fiber 20 are aligned so that the power is physically halved, making it possible to evenly divide the power of the light.

[Magnetic Sensor Module]

Figure 9:
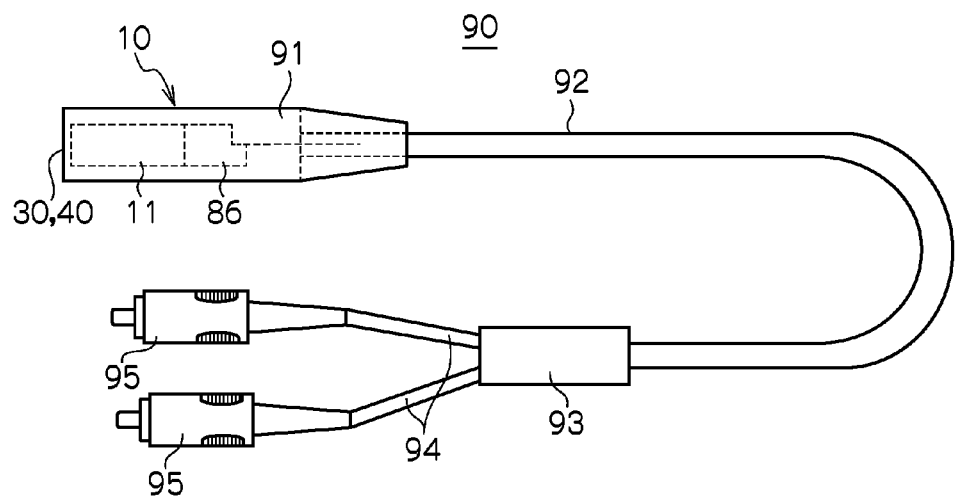
FIG. 9 is a schematic view illustrating an example of a structural form of a magnetic sensor module provided with the magnetic sensor element.

FIG. 9 is a schematic view illustrating an example of a structural form of a magnetic sensor module 90 provided with the magnetic sensor element 10 according to the above-described present invention. This magnetic sensor module 90 is an optical fiber cable unit including the magnetic sensor element 10 provided to one end of a double-core optical fiber cable 92, and connecting terminal parts 95, 95 provided to the other end.

Figure 10A:
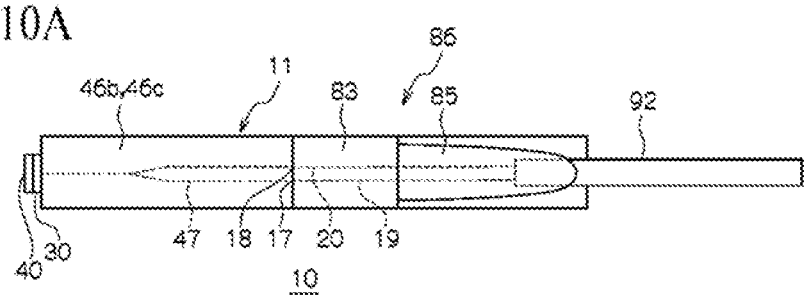
FIG. 10A illustrates a plan view.
Figure 10B:
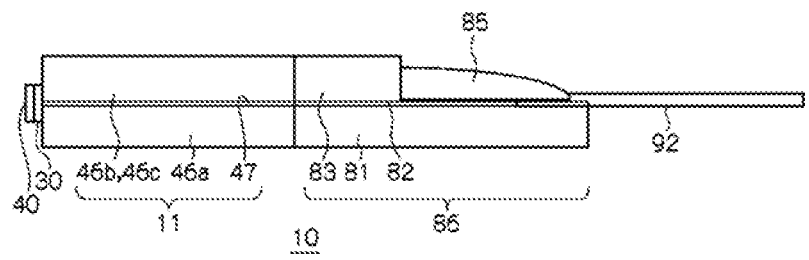
FIG. 10B illustrates a side view.

While each component of the magnetic sensor element 10 has already been described and thus the description thereof is omitted, it is preferable that the magnetic sensor element 10 is fabricated by the structure form illustrated in FIGS. 10A and 10B. The magnetic sensor element 10 having the structure illustrated in FIGS. 10A and 10B is configured by the planar lightwave circuit 11 and a connecting structure part 86. Although the planar lightwave circuit 11 is not particularly limited, the circuit illustrated in FIGS. 6A to 6C can be preferably exemplified, and is configured by the lower clad layer 46a, the core 47, and the upper clad layers 46b, 46c. The metal magnetic body type light transmitting film 30 and the reflecting film 40 are sequentially laminated at a tip end portion of the planar lightwave circuit 11.

The double-core optical fiber cable 92 is obtained by covering two optical fiber core wires with a resin sheath. One side of the double-core optical fiber cable 92 is branched into single-core optical fiber cables 94, 94 by a branching part 93, respectively, and the single-core optical fiber cables 94, 94 are respectively connected to the optical connecting terminal parts (also referred to as optical connectors) 95, 95. These optical connecting terminal parts 95, 95 are connected to a measuring instrument provided with an optoelectronic (OE) conversion element photodiode (PD).

The other side of the double-core optical fiber cable 92 is connected to the magnetic sensor element 10. FIGS. 10A and 10B are an example of the connecting structure. As illustrated in FIGS. 10A and 10B, when the resin sheath is removed from the double-core optical fiber cable 92, the double-core optical fiber cable 92 become optical fiber core wires having a single core, and preferably the optical fibers in which the coating material is peeled from the optical fiber core wires are the polarization-plane maintaining optical fibers 19, 20 as described above. As illustrated in FIGS. 8A to 8C and FIGS. 10A and 10B, each of the polarization-plane maintaining optical fibers 19, 20 is positioned in the groove part 82 provided in the base member 81, and becomes the connecting structure part 86 fixed by the lid member 83 via the adhesive 84. The polarization-plane maintaining optical fibers 19, 20 exposed on the base member 81 are covered with an adhesive 85 as illustrated in FIGS. 10A and 10B, and integrated with and protected by the base member 81.

The planar lightwave circuit 11 and the connecting structure part 86 thus configured are connected by the connecting parts 17, 18 with an adhesive. After being connected, the planar lightwave circuit 11 and the connecting structure part 82 are reinforced by and integrated with a resin case 91 as illustrated in FIG. 9. Thus, the magnetic sensor module 90 can be fabricated.

[Magnetic Sensor Device]

As illustrated in FIG. 5, the magnetic sensor device 1 according to the present invention includes the magnetic sensor module 90 provided with the magnetic sensor element 10 described above, the light-emitting device 50 that introduces linearly polarized light into the input optical fiber 19 of the magnetic sensor element 10, and the light-receiving device 60 that receives return light derived from the output optical fiber 20 of the magnetic sensor element 10.

In this magnetic sensor device 1, the input optical fiber 19 connected to the planar lightwave circuit 11 is optically connected to the light-emitting device 50 including a light-emitting element 51 and the like via the connecting terminal part 95 (refer to FIG. 9). Further, the output optical fiber 20 connected to the planar lightwave circuit 11 is optically connected to the light-receiving device 60 as well, including the light-receiving element 66P, 66S, and the like via the connecting terminal part 95 (refer to FIG. 9). With this connection form, in the light-emitting device 50, the light from the light-emitting element 51 serves as linearly polarized light by a polarizer 52, and the linearly polarized light enters the planar lightwave circuit 11 illustrated in FIG. 1 and FIG. 2 via the input optical fiber 19. The linearly polarized light is transmitted through the metal magnetic body type light transmitting film 30, is reflected by the reflecting film 40, transmitted through the metal magnetic body type light transmitting film 30 again, passes through the optical paths 14, 15, and enters the output optical fiber 20. When a magnetic field is applied to the metal magnetic body type light transmitting film 30, which is the tip end of the magnetic sensor element 10, the polarized-light plane rotates in accordance with the magnetic field strength thereof.

The light that has entered the output optical fiber 20 enters the light-receiving device 60. The light-receiving device 60 includes a polarization separating element 64 that separates the return light into an S-polarized component and a P-polarized component, the light-receiving elements 66P, 66S that receive and convert the S-polarized component and the P-polarized component into electrical signals, and a signal processing part 70 that processes the electrical signals.

<Light-Emitting Device>

The light-emitting device 50 is configured to include the light-emitting element 51 and the polarizer 52 that converts light emitted from the light-emitting element 51 into linearly polarized light. Reference numeral 53 denotes an isolator, which can be provided as necessary. This light-emitting device 50 is a device that introduces linearly polarized light into the input optical fiber 19 of the magnetic sensor element 10. The polarizer 52 linearly polarizes light, and the linearly polarized light is introduced into the input optical fiber 19 constituting the magnetic sensor element 10.

Examples of the light-emitting element 51 applied include a semiconductor laser, a light-emitting diode, or the like. Specifically, a Fabry-Perot laser, a super luminescence diode, or the like can be preferably used as the light-emitting element 51.

The polarizer 52 is an optical element for converting light emitted from the light-emitting element 51 into linearly polarized light, and the type thereof is not particularly limited, allowing use of various types.

The linearly polarized light can be introduced into the input optical fiber 19 using an optical coupler, a circulator, a half mirror, or the like. The half mirror (not illustrated) is an optical element that introduces the linearly polarized light polarized by the polarizer 52 into the input optical fiber 19 and propagates the return light propagated through the input optical fiber 19 to a system different from that of the light source side. It should be noted that, instead of a half mirror, an optical coupler for coupling and branching an optical fiber, a beam splitter for splitting light, or an optical circulator may be used.

<Light-Receiving Device>

The light-receiving device 60 is configured to include the polarization separating element 64 that separates the light emitted from the planar lightwave circuit 11 into an S-polarized component and a P-polarized component, the light-receiving elements 66P, 66S that receive and convert the S-polarized component and the P-polarized component into electrical signals, and the signal processing part 70 that processes the electrical signals.

(Polarization Separating Element)

The polarization separating element 64 is an optical element that respectively branches the S-polarized component and the P-polarized component of the light. Preferable examples of the polarization separating element 64 include a polarizing beam splitter (PBS). Polarizing beam splitters of various types, such as a prism type, a plane type, a wedge substrate type, and an optical waveguide type, can be applied.

(Light-Receiving Element)

The light-receiving elements 66P, 66S are optical elements that respectively receive and photoelectrically convert the S-polarized component and the P-polarized component branched by the polarization separating element 64, and preferable examples include a PIN photodiode or the like.

(Signal Processing Part)

The signal processing part 70 detects the difference between the intensities of the two polarized lights from the photoelectrically converted electrical signals using a circuit, and converts the intensities into a desired measured value such as a magnetic field strength value or a current value based on the difference.

As described above, according to the magnetic sensor element 10 and the magnetic sensor device 1 of the present invention, it is not necessary to provide a wave plate in the planar lightwave circuit, and thus it is possible to detect the light intensity that suppresses loss due to provision of the wave plate and, because the wave plate is no longer required, to detect the light intensity directly. Further, because an optical coupler is not provided, there is also the advantage that there is no impact by disturbance (temperature, simple contact).

Examples

The following describes the magnetic sensor element 10 according to the present invention in further detail. In the experiment described below, a relationship between insertion loss of the magnetic sensor module 90 including the magnetic sensor element 10 and the Faraday rotation angle was examined, and the insertion loss of the magnetic sensor module 90 that can be preferably used was verified.

<Fabrication of Measurement Sample>

The planar lightwave circuit 11 illustrated in FIGS. 6A to 6C was fabricated by photolithographic technology. In this planar lightwave circuit 11, a $SiO_2$ substrate (quartz, Tempax (registered trademark), or the like) having a thickness of 1 mm was used as the lower clad layer 46a, the core 47 that is 0.006-mm square (vertical×horizontal) was pattern-formed thereon in a 1×2 channel form, the upper clad layer 46b made of $SiO_2$ and having a thickness of 0.025 mm was formed thereon, and the upper clad layer 46c having a thickness of 1.5 mm was further formed thereon via the epoxy-based adhesive 48.

The metal magnetic body type light transmitting film 30 and the reflecting film 40 were sequentially laminated at the end portion of the planar lightwave circuit 11. As the metal magnetic body type light transmitting film 30, a granular thin film in which the Faraday rotation is saturated at approximately 5 kOe was used. Specifically, Co fine particles having an average particle diameter of 7 nm and $MgF_2$ used for the matrix were simultaneously evaporated at a volume ratio of $Co/MgF_2=½$ to form a granular thin film having a thickness of 1,380 nm. Further, as the reflecting film 40, a gold film having a thickness of 150 nm and a reflectance of 98% and formed by a sputtering method was used. The fact that the Faraday rotation is saturated at approximately 5 kOe in this granular thin film was shown from the results from forming only the granular thin film and then measuring the film using a vibrating sample magnetometer (VSM). Thus, the planar lightwave circuit 11 was fabricated.

The double-core optical fiber cable 92 was connected to the connecting parts 17, 18 of this planar lightwave circuit 11. The double-core optical fiber cable 92 is a cable cord in which two single-core optical fiber cables are covered with a resin sheath, and the single-core optical fiber cables are each an optical fiber core wire having a diameter of about 900 μm and covered with a coating material such as nylon. As the optical fiber with the coating material removed from this optical fiber core wire, the polarization-plane maintaining optical fibers 19, 20 having a diameter of 0.125 mm were prepared, and an optical fiber covered with an acrylic resin on the outer periphery of the polarization-plane maintaining optical fibers 19, 20 and having a diameter of 250 μm was used. These polarization-plane maintaining optical fibers 19, 20 were connected to the planar lightwave circuit 11 as the connecting structure part 86 illustrated in FIGS. 10A and 10B.

Connection between the connecting parts 17, 18 of the planar lightwave circuit 11 and the polarization-plane maintaining optical fibers 19, 20 was performed using an adhesive (a refractive index-matched UV curing type adhesive). First, an end portion of the output polarization-plane maintaining optical fiber 20 was connected to the connecting part 18 of the planar lightwave circuit 11. Next, the input polarization-plane maintaining optical fiber 19 was connected to the connecting part 17 of the planar lightwave circuit 11. At this time, the input polarization-plane maintaining optical fiber 19 was axially rotated and connected so that the relative angle θ with respect to the polarized-light preserving axis of the output polarization-plane maintaining optical fiber 20 was 45°. During this connection, alignment using an active alignment device was not performed. Thus, the magnetic sensor module 90 was fabricated.

<Insertion Loss and Faraday Rotation Angle>

Figure 11:
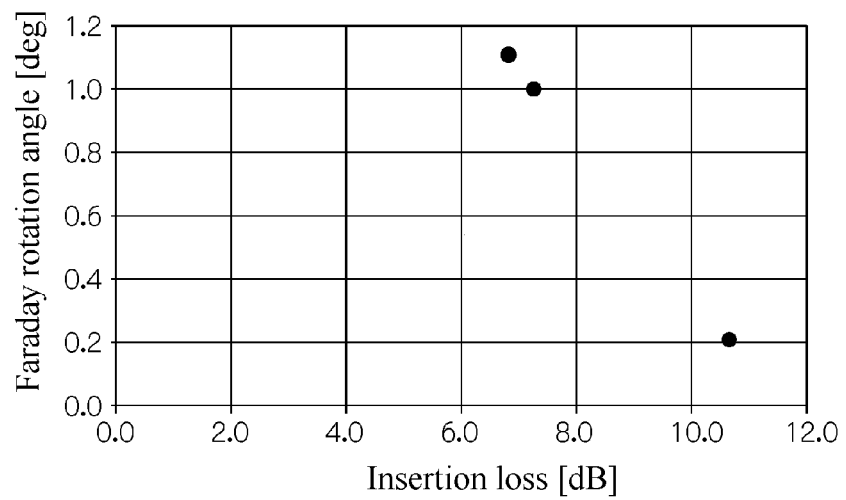
FIG. 11 is a graph showing results of Table 1 and a relationship between insertion loss and a Faraday rotation angle.

Samples 1 to 3 in Table 1 are three types of magnetic sensor modules 90 with different insertion losses. FIG. 11 shows the results of Table 1 in a graph. The different insertion losses at this time were obtained by intentionally causing an alignment error during connection between the planar lightwave circuit 11 and the optical fibers (polarization-plane maintaining optical fibers 19, 20). In this experiment, by examining the relationship between the change in insertion loss caused by the alignment error and the change in Faraday rotation angle, to what extent of an insertion loss allows detection of light that changes by the Faraday rotation angle and permission of the function of the magnetic sensor element was verified. The measurement of insertion loss was performed using the measurement system illustrated in FIG. 5.

TABLE 1

| | Insertion loss [dB] | | | |
|---|---|---|---|---|
| | P-polarized light (Slow axis) | S-polarized light (Fast axis) | Average | Faraday rotation angle [deg] |
| Sample 1 | 7.2 | 6.4 | 6.8 | 1.1 |
| Sample 2 | 7.9 | 6.6 | 7.3 | 1.0 |
| Sample 3 | 11.2 | 10.0 | 10.6 | 0.2 |

As shown in Table 1 and FIG. 11, in Sample 1, the insertion loss was 6.8 dB, and the Faraday rotation angle was 1.1° (deg). In Sample 2, the insertion loss was 7.3 dB, and the Faraday rotation angle was 1.0° (deg). In Sample 3, the insertion loss was 10.6 dB, and the Faraday rotation angle was 0.2° (represented by deg; hereinafter the same).

The difference in insertion loss of the magnetic sensor module 90 is largely caused by an alignment error that occurs when the planar lightwave circuit 11 and the connecting structure part 86 are connected. When an alignment error occurs, the insertion loss increases by a shift that occurs between the optical fibers 19, 20 and the cores of the optical paths 13, 15 of the planar lightwave circuit 11, and by a polarization dependence that occurs between the cores as well. In the present invention, it can be said that the mode is configured by sandwiching the planar lightwave circuit 11 between the polarization-plane maintaining optical fibers 19, 20 and therefore, in this mode, preferably the linearly polarized light emitted from the polarization-plane maintaining optical fiber 19 can be propagated in a state in which the interior of the planar lightwave circuit 11 is regarded as a space, maintaining the polarization state. Further, preferably the information maintained in the other polarization-plane maintaining optical fiber 20 is output and propagated while the next Faraday rotation angle that occurs in the metal magnetic body type light transmitting film 30 and the reflecting film 40 is maintained as is. Nevertheless, when a loss due to polarization dependence occurs in the input-side connecting part 17 and the output-side connecting part 18 of the planar lightwave circuit 11, the intensity change of the light caused by Faraday rotation is offset by the loss due to polarization dependence, and the Faraday rotation angle becomes small, as shown in Table 1.

<Magnetic Field Strength and Faraday Rotation Angle>

Figure 12:
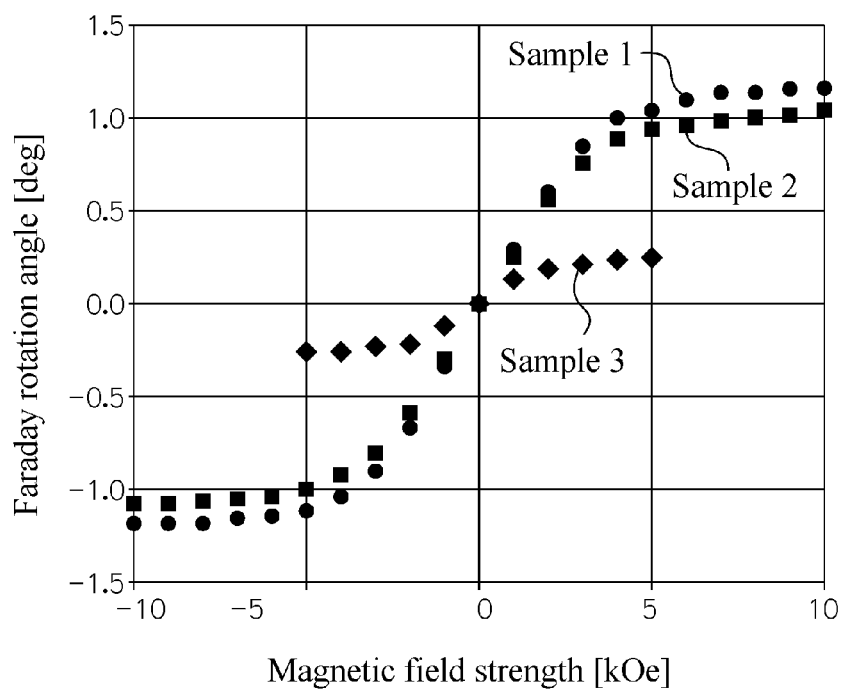
FIG. 12 is a graph showing a relationship between a magnetic field strength of a metal magnetic body type light transmitting film and the Faraday rotation angle for Samples 1 to 3 used in an experiment.

FIG. 12 is a graph showing the relationship between the magnetic field strength of the metal magnetic body type light transmitting film 30 and the Faraday rotation angle for Samples 1 to 3 used in this experiment. The metal magnetic body type light transmitting film 30 adopted in this experiment has strong shape anisotropy and thus high saturation magnetization (the Faraday rotation is saturated at approximately 5 kOe), and therefore it can be said that measurement of a considerably large magnetic field=current value is possible. From these results, it is understood that, in Samples 1 to 3 used in this experiment, Sample 1 showing a Faraday rotation angle of 1.1° and Sample 2 showing a Faraday rotation angle of 1.0° have a direct (linear) relationship between the magnetic field strength within the range of approximately −4 kOe to +4 kOe and the Faraday rotation angle and thus the Faraday rotation angle of the metal magnetic body type light transmitting film 30 can respond to changes in magnetic field strength, while Sample 3 showing a Faraday rotation angle of only 0.2° has only a few linear portions and thus the Faraday rotation angle of the metal magnetic body type light transmitting film 30 does not readily respond to changes in magnetic field strength. It should be noted that, realistically, because the current value generated in a switching device such as an inverter is 200 Atyp, the magnetic field generation amount is considered to be about 100 Oe. This 100 Oe is a rotation angle of about 1/50 of the entirety, that is, about 0.028 deg.

<Faraday Rotation Angle and Light Intensity>

Figure 13:
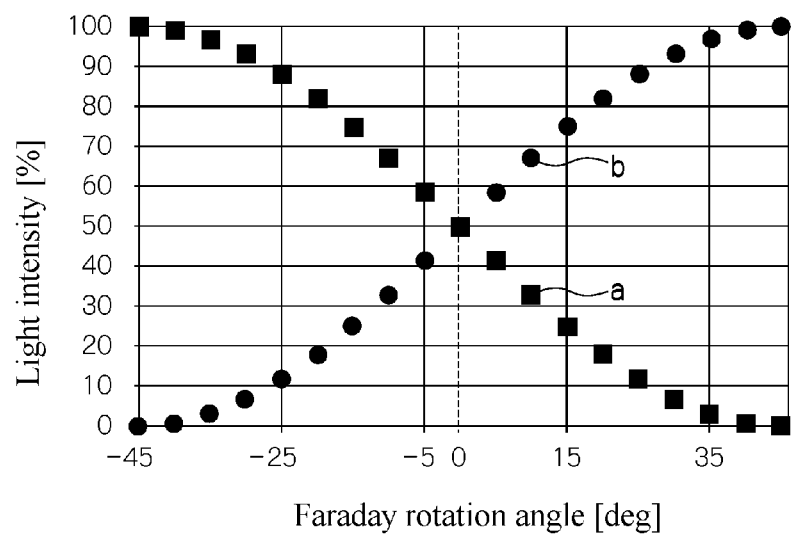
FIG. 13 is a graph showing a general relationship between the Faraday rotation angle and light intensity change, symbol a denoting a P-polarization intensity change represented by $\sin^2(\theta F+\pi/4)$, and symbol b denoting S-polarization intensity change represented by $\cos^2(\theta F+\pi/4)$.

Incidentally, as a principle of the magnetic sensor element 10 according to the present invention, the light intensity is detected on the basis of the fact that there is a proportional relationship between a change in the obtained linear approximate region and magnetic field strength, using the difference in the light intensities of each of the P-polarized light and the S-polarized light (refer to Formula 1 described below). Specifically, FIG. 13 is a graph showing a general relationship between the Faraday rotation angle and light intensity change, including data of other magnetic materials (including garnet or the like), the symbol a denoting a P-polarization intensity change represented by $\sin^2(\theta F+\pi/4)$, and the symbol b denoting an S-polarization intensity change represented by $\cos^2(\theta F+\pi/4)$. As shown in FIG. 13, the changes in the light intensities of each of the P-polarized light and the S-polarized light indicate a relationship such that the light intensities increase or decrease relative to each other in response to the Faraday rotation.

$$\sin^2(\theta F+\pi/4)-\cos^2(\theta F+\pi/4) \quad \text{(Formula 1)}$$

Figure 14:
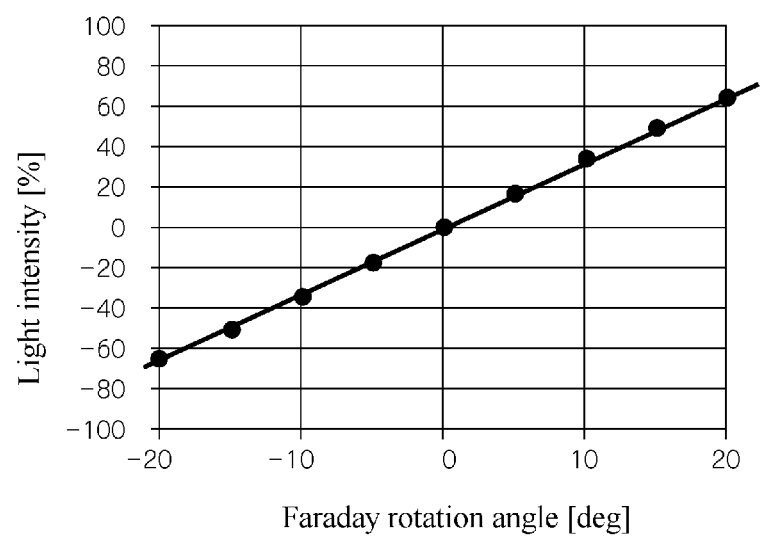
FIG. 14 is a graph drawn by subtracting the P-polarization intensity from the S-polarization intensity shown in FIG. 13 and subjecting the horizontal axis to Faraday rotation.

FIG. 14 is a graph shown by subtracting the P-polarization intensity from the S-polarization intensity shown in FIG. 13 and subjecting the horizontal axis to Faraday rotation. As understood from the graph of FIG. 14, the region that can be linearly approximated is −10° to +10°. Accordingly, because Samples 1 and 2 showing the Faraday rotation angles of 1.0° and 1.1° are included in the linear region where linear approximation is possible, it is understood that the relationship between the Faraday rotation angle and the light intensity is 1:1, which is advantageous in terms of detection accuracy.

<Insertion Loss and Light Intensity Change Amount>

The planar lightwave circuit 11 of this experiment includes the light branching part 12 (refer to FIG. 1), and thus the light intensity is 50% and the loss is 3 dB in an advancing direction, and further the light intensity is 50% and the loss is 3 dB in the returning direction, resulting in a total of 6 dB. Furthermore, a total of about 0.5 dB is added as a connection loss at the two connecting parts 17, 18 of the planar lightwave circuit 11 and the connecting structure part 86. Accordingly, a total loss of 6.5 dB can be said to be the minimum ideal loss. Actually, other loss was slightly added and, as shown in Sample 1 of Table 1, the insertion loss was 6.8 dB and the Faraday rotation angle was 1.1°.

Figure 15:
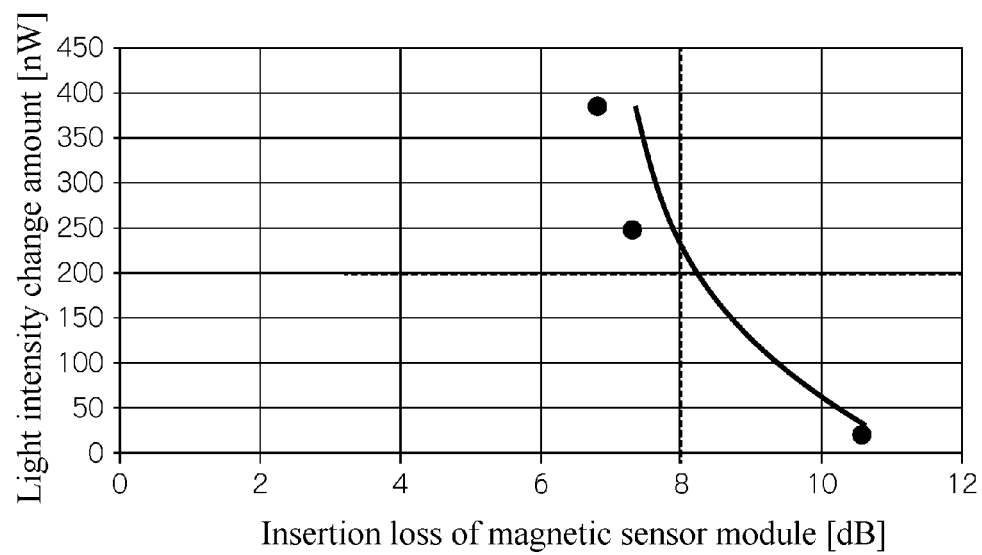
FIG. 15 is a graph showing a relationship between the insertion loss of the magnetic sensor module and an amount of change in light intensity.

FIG. 15 is a graph showing a relationship between the insertion loss of the magnetic sensor module and an amount of change in light intensity. In this experiment, because a super luminescent diode (SLD) having a light source power of 25 mW is used, the transmittance of the entire measurement system illustrated in FIG. 5 is approximately 2%, and thus the obtained light intensity is 500 µW. Furthermore, because the intensity of the light that changes by the Faraday rotation angle of 0.028 deg described above is about +/−0.1%, a change of +/−400 nW is obtained.

The light intensity changed by the Faraday rotation angle is amplified by an amplifier located in the signal processing part and subjected to signal demodulation, but the intensity of the light actually needs to be received by a photodiode (PD). For these reasons, as long as the light intensity change amount is about 150 nW or greater, detection is possible taking into consideration PD sensitivity and noise level. On the other hand, when the amount becomes less than 150 nW, the loss exceeds 8 dB, sensitivity decreases, and measurement becomes difficult. From these, in the magnetic sensor module 90, it can be said that the loss of the planar lightwave circuit 11 is preferably 8 dB or less as shown in FIG. 15.

As described above, according to the present invention, it is possible to provide a magnetic sensor element and a magnetic sensor device that can be easily manufactured and can reduce a loss of light of the planar lightwave circuit 11 to the extent possible. In particular, the magnetic sensor element 10 according to the present invention includes the planar lightwave circuit 11, and thus the polarization plane is readily maintained in the planar lightwave circuit even with disturbance caused by twisting, bending, or the like, making it possible to precisely propagate a phase modulation that occurs by Faraday rotation. Then, the input optical fiber 19 and the output optical fiber 20 are preferably both composed of polarization-plane maintaining optical fibers and aligned and connected to the planar lightwave circuit 11, making it not necessary to provide a wave plate in the planar lightwave circuit. In addition, the loss due to the provision of the wave plate can be greatly suppressed and, for example, the loss of the planar lightwave circuit 11 can also be 8 dB or less, as illustrated in FIG. 15.

DESCRIPTIONS OF REFERENCE NUMERALS

1 Magnetic sensor device
10 (10A, 10B) Magnetic sensor element
11 Planar lightwave circuit (PLC)
11a Optical waveguide 12 Light branching part
13, 14, 15, 16 Optical path
17, 18 Connecting part
19 Input optical fiber
20 Output optical fiber
21 Core
22 Clad
23 (23a, 23b) Stress applying part
24 Slow axis
25 Fast axis
26 Coating material
30 Metal magnetic body type light transmitting film
40 Reflecting film
41 Substrate
42 Groove
43 Lid base material
44 Embedding optical fiber
45 Adhesive
46a Lower clad layer
46b First upper clad layer
46c Second upper clad layer
47 Core
48 Adhesive layer
50 Light-emitting device
51 Light-emitting element
52 Polarizer
53 Half mirror
54 Optical coupling part
60 Light-receiving device
62 λ/2 plate
64 Polarization separating element (Polarization separating beam splitter)
65P P-polarized component
65S S-polarized component
66P, 66S Light-receiving element (Photodiode)
70 Signal processing part
81 Base member
82 Groove part
83 Lid member
84 Adhesive
85 Adhesive
86 Connecting structure part
90 Magnetic sensor module
91, 91a, 91b Resin case
92 Double-core optical fiber cable
93 Branching part
94 Single-core optical fiber cable
95 Connecting terminal part

What is claimed is:

1. A magnetic sensor element comprising:
a planar lightwave circuit provided with a light branching part;
an input optical fiber and an output optical fiber connected to one end surface of the planar lightwave circuit;
a metal magnetic body type light transmitting film that is provided directly on another end surface of the planar lightwave circuit and transmits light entered from the input optical fiber;
a reflecting film that is provided on the metal magnetic body type light transmitting film and reflects the transmitted light,
a light-emitting device that introduces linearly polarized light into the input optical fiber of the magnetic sensor element;
a light-receiving device that receives return light derived from the output optical fiber of the magnetic sensor element; wherein said light receiving device comprises:
a polarization separating element that separates the return light received from the output optical fiber of the magnetic sensor element into an S-polarized component and a P-polarized component,
a light-receiving element that receives the S-polarized component and the P-polarized component and converts the S-polarized component and the P-polarized component into electrical signals, and
a signal processing part that processes the electrical signals;
the output optical fiber being a polarization-plane maintaining optical fiber configured to maintain a polarization-plane of light emitted from the planar lightwave circuit, and
the input optical fiber and the output optical fiber being aligned and connected to the planar lightwave circuit.

2. The magnetic sensor element according to claim 1, wherein
the input optical fiber and the output optical fiber are rotationally adjusted and connected.

3. The magnetic sensor element according to claim 1, wherein
the input optical fiber is a polarization-plane maintaining optical fiber, and a polarization preserving axis of the input polarization-plane maintaining optical fiber is aligned with a polarization preserving axis of the output polarization-plane maintaining optical fiber.

4. The magnetic sensor element according to claim 3, wherein
the polarization preserving axis of the input polarization-plane maintaining optical fiber and the polarization preserving axis of the output polarization-plane maintaining optical fiber are aligned at a relative angle of 45° with respect to one another.

5. The magnetic sensor element according to claim 1, wherein
the planar lightwave circuit comprises a substrate and an optical waveguide, the optical waveguide is formed by patterning or obtained by melting two optical fibers, and the optical waveguide is fixed to the substrate.

6. The magnetic sensor device according to claim 1, wherein
the light-emitting device comprises a light-emitting element and a polarizer that converts light emitted from the light-emitting element into linearly polarized light.

* * * * *